(12) United States Patent
Kondo et al.

(10) Patent No.: US 10,148,276 B1
(45) Date of Patent: Dec. 4, 2018

(54) DA CONVERTER AND ADPLL CIRCUITRY

(71) Applicant: KABUSHIKI KAISHA TOSHIBA, Minato-ku (JP)

(72) Inventors: Satoshi Kondo, Kawasaki (JP); Akihide Sai, Yokohama (JP); Tetsuro Itakura, Nerima (JP)

(73) Assignee: KABUSHIKI KAISHA TOSHIBA, Minato-ku (JP)

( * ) Notice: Subject to any disclaimer, the term of this patent is extended or adjusted under 35 U.S.C. 154(b) by 0 days.

(21) Appl. No.: 15/923,642

(22) Filed: Mar. 16, 2018

(30) Foreign Application Priority Data

Sep. 14, 2017 (JP) .................................. 2017-176987

(51) Int. Cl.
*H03M 1/06* (2006.01)
*G04F 10/00* (2006.01)
*H03L 7/099* (2006.01)

(52) U.S. Cl.
CPC ........ *H03M 1/0607* (2013.01); *G04F 10/005* (2013.01); *H03L 7/099* (2013.01); *H03L 2207/50* (2013.01)

(58) Field of Classification Search
CPC .... H03M 1/0607; G04F 10/005; H03L 7/099; H03L 2207/50
USPC ............ 327/141–163; 331/44, 179; 341/120, 341/121, 126–172
See application file for complete search history.

(56) References Cited

U.S. PATENT DOCUMENTS

| | | | |
|---|---|---|---|
| 6,658,748 B1 | 12/2003 | Leipold et al. | |
| 7,675,370 B2 | 3/2010 | Sun et al. | |
| 2011/0018753 A1* | 1/2011 | Lou ...................... | H03M 7/3022 341/144 |
| 2011/0074613 A1* | 3/2011 | Newman ............. | H03M 1/0665 341/143 |
| 2012/0007643 A1* | 1/2012 | Jian ....................... | H03L 7/1976 327/157 |
| 2015/0326240 A1* | 11/2015 | Tousi .................. | H03M 1/1038 341/118 |
| 2015/0341042 A1* | 11/2015 | Balachandran ......... | H03L 7/099 327/156 |

FOREIGN PATENT DOCUMENTS

JP 60-29023 2/1985

* cited by examiner

*Primary Examiner* — Thomas Skibinski
(74) *Attorney, Agent, or Firm* — Oblon, McClelland, Maier & Neustadt, L.L.P.

(57) ABSTRACT

A DA converter has a first DA conversion unit that converts a first bit string signal corresponding to a MSB side string of a digital input signal into a first analog value, a second DA conversion unit that converts a second bit string signal corresponding to an LSB side string of the digital input signal into a second analog value, a third DA conversion unit that has identical circuitry configuration and identical circuitry area as the second DA conversion unit and converts a first digital signal into a third analog value, an analog calculator that calculates a value obtained by subtracting the third analog value from a value obtained by adding the second analog value to the first analog value, a quantizer that outputs a second digital signal obtained by quantizing an output value of the analog calculator, and a control logic unit that generates the first digital signal.

20 Claims, 7 Drawing Sheets

DA CONVERTER AND ADPLL CIRCUITRY

CROSS REFERENCE TO RELATED APPLICATIONS

This application is based upon and claims the benefit of priority from the prior Japanese Patent Application No. 2017-176987, filed on Sep. 14, 2017, the entire contents of which are incorporated herein by reference.

FIELD

Embodiments of the present disclosure relate to a DA converter and ADPLL circuitry.

BACKGROUND

In general, a DA converter having a high resolution includes a higher-order bank that performs DA conversion of a more significant bit and a lower-order bank that performs DA conversion of a less significant bit. Typically, there is a mismatch in electrical characteristics between the higher-order bank and the lower-order bank. It is necessary to perform adjustment such that gains coincide with each other between the higher-order bank and the lower-order bank in order to maintain the continuity in output of the DA converter even if there is the mismatch. This adjustment is desirably performed during a continuous DA conversion operation.

A gain calibration method of causing a DA converter to follow gain drift during a continuous DA conversion operation has been known. In this method, a comparator compares an output of a low-speed and high-precision reference DA converter and an output of a main DA converter that performs DA conversion of actual data to detect the gain drift of the output of the main DA converter, and a correction voltage is fed back to the main DA converter. As a result, the gain of the main DA converter is corrected, and it is possible to perform the operation to follow the gain drift. However, it is difficult to perform gain calibration between higher-order and lower-order banks with such a method.

DETAILED DESCRIPTION

Figure 1:
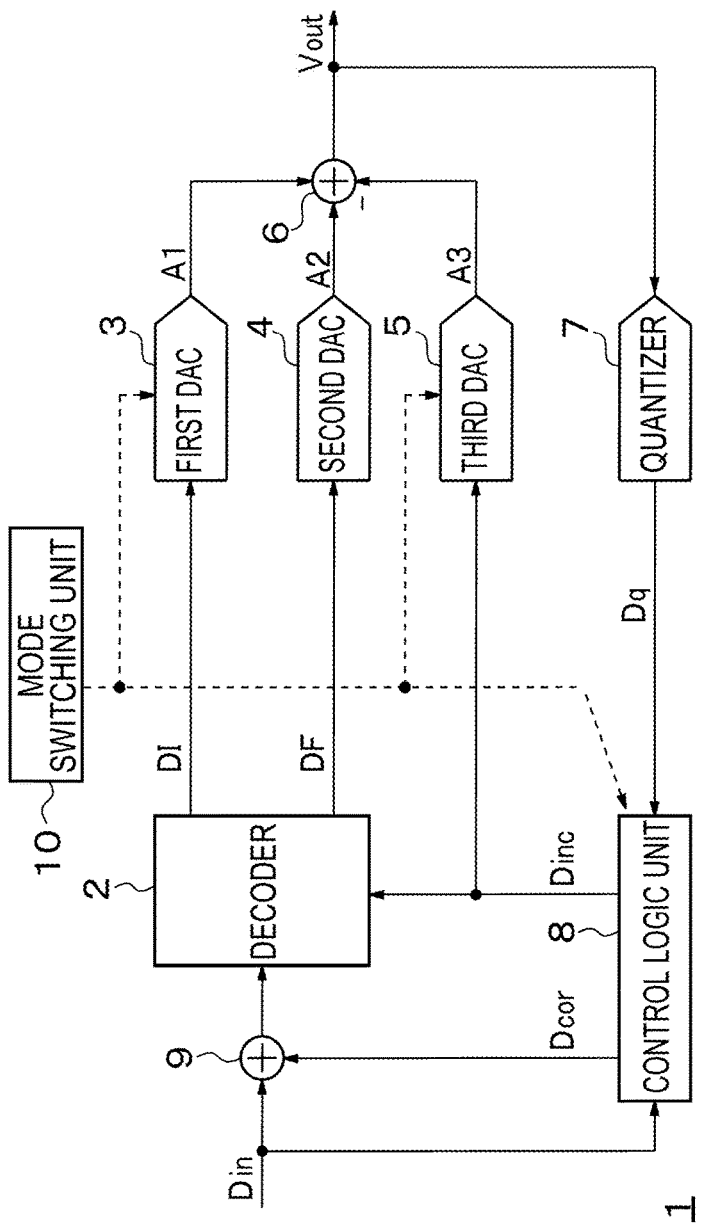
FIG. 1 is a block diagram illustrating a schematic configuration of a DA converter according to a first embodiment.

According to one embodiment, a DA converter has a first DA conversion unit that converts a first bit string signal corresponding to a MSB side string of a digital input signal having a plurality of bits into a first analog value, a second DA conversion unit that converts a second bit string signal corresponding to an LSB side string of the digital input signal into a second analog value, a third DA conversion unit that has identical circuitry configuration and identical circuitry area as the second DA conversion unit and converts a first digital signal into a third analog value, an analog calculator that calculates a value obtained by subtracting the third analog value from a value obtained by adding the second analog value to the first analog value, a quantizer that outputs a second digital signal obtained by quantizing an output value of the analog calculator, and a control logic unit that generates the first digital signal such that the digital input signal coincides with the second digital signal.

Hereinafter, embodiments will be described with reference to the drawings. In the present specification and accompanying drawings, the description and illustration are given by omitting, changing, or simplifying some components for ease of understanding and convenience in illustration, but technical contents at the extent with which similar functions can be expected are also interpreted as being included in the embodiments. In addition, in the drawings appended to the specification of the present application, scales and horizontal and vertical dimension ratios are appropriately changed and exaggerated as compared to actual ones thereof in order for convenience of illustration and facilitating the understanding.

First Embodiment

FIG. 1 is a block diagram illustrating a schematic configuration of a DA converter 1 according to a first embodiment. The DA converter 1 in FIG. 1 includes a decoder 2, a first DA conversion unit (hereinafter referred to as a first DAC) 3, a second DA conversion unit (hereinafter referred to as a second DAC) 4, a third DA conversion unit (hereinafter referred to as a third DAC) 5, an analog calculator 6, a quantizer 7, a control logic unit 8, a first digital calculator 9, and a mode switching unit 10.

The decoder 2 outputs a first bit string signal DI corresponding to a more significant bit (MSB) side of a digital input signal Din having a plurality of bits and a second bit string signal DF corresponding to a least significant bit (LSB) side. More specifically, the decoder 2 receives a carry code (first digital signal Dinc) indicating a carry position from a LSB side string to a MSB side string from the control logic unit 8, generates the first bit string signal DI based on the following Formula (1), and generates the second bit string signal DF based on the following Formula (2).

$$DI = D\text{in} - \text{MOD}(D\text{in}, D\text{inc}) \quad (1)$$

$$DF = \text{MOD}(D\text{in}, D\text{inc}) \quad (2)$$

The first digital calculator 9 is provided in a preceding stage of the decoder 2. The first digital calculator 9 outputs a fourth digital signal obtained by adding the digital input signal Din and a third digital signal Dcor, which will be described later, output from the control logic unit 8. This fourth digital signal is input to the decoder 2. The third digital signal Dcor is a correction signal that is used when performing an operation following an overall gain drift of the DA converter 1 of FIG. 1 as will be described later. When the operation following the overall gain drift is not performed, the third digital signal Dcor becomes zero, and the digital input signal Din of the first digital calculator 9 is directly input to the decoder 2.

The first DAC 3 converts the first bit string signal DI into a first analog value A1. The second DAC 4 converts the second bit string signal DF into a second analog value A2. The number of bits of each of the first bit string signal DI and the second bit string signal DF is arbitrary.

In the example of FIG. 1, the digital input signal Din is divided into two bit strings, that is, the MSB side string and the LSB side string, and then, the strings are allocated to the first DAC 3 and the second DAC 4, respectively. However, when the number of bits of the digital input signal Din is large, the digital input signal Din may be divided into three or more bit strings and then input to the separate DA converters 1. The present embodiment can also be applied to a case where the digital input signal Din is subjected to DA conversion by the three or more DA converters 1. When the three or more DA converters 1 are used, it is possible to regard that arbitrary two DA converters 1 among them are illustrated in FIG. 1. Hereinafter, a description will be given regarding an example in which the digital input signal Din is divided into two bit strings, that is, the MSB side string and the LSB side string, and then, the strings are subjected to DA conversion by the first DAC 3 and the second DAC 4 in order to simplify the description.

The third DAC 5 has the identical circuitry configuration and the identical circuitry area as the second DAC 4 and converts the first digital signal Dinc into a third analog value A3. The first digital signal Dinc input to the third DAC 5 is a carry code output from the control logic unit 8 as will be described later. Since the third DAC 5 has the identical circuitry configuration and the identical circuitry area as the second DAC 4, the third DAC 5 will be referred to as a replica of the second DAC 4 hereinafter. It may be assumed that the third DAC 5 has the same electric characteristics as the second DAC 4, and the second DAC 4 and the third DAC 5 have the same gain drift. For example, the third DAC 5 is disposed to be adjacent to the second DAC 4 on the same semiconductor substrate in the same manufacturing process as the second DAC 4.

By providing the third DAC 5 as the replica of the second DAC 4, the gain drift of the second analog value A2 output from the second DAC 4 can be matched with the gain drift of the third analog value A3 output from the third DAC 5.

The analog calculator 6 calculates a value obtained by subtracting the third analog value A3 from a value obtained by adding the second analog value A2 to the first analog value A1. An analog value which is a calculation result of the analog calculator 6 is output as a DA conversion result Vout of the DA converter 1 of FIG. 1 and is input to the quantizer 7.

Figure 2:
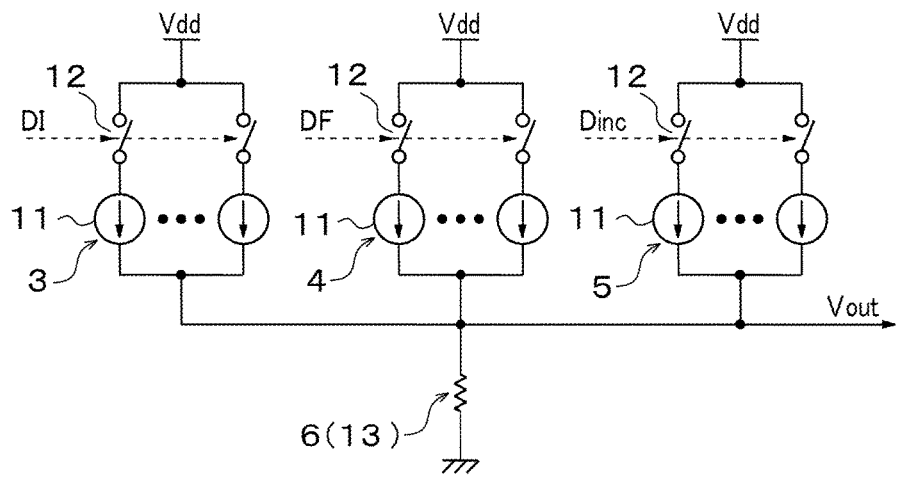
FIG. 2 is a block diagram illustrating an example of an internal configuration of first to third DACs and an analog calculator.

FIG. 2 is a block diagram illustrating an example of an internal configuration of the first DAC 3, the second DAC 4, the third DAC 5, and the analog calculator 6. In the example of FIG. 2, each of the first DAC 3, the second DAC 4, and the third DAC 5 has a plurality of current sources 11 and a plurality of switches 12 each of which switches whether or not to operate each of the current sources 11. In addition, the analog calculator 6 has a resistor 13 connected between each one end of all the current sources 11 and a ground node. A connection node between each of the current sources 11 and the resistor 13 is an output node of the DA converter 1 in FIG. 1, and the analog value Vout obtained by the DA conversion of the digital input signal Din is output from this node.

The plurality of current sources 11 and the plurality of switches 12 for the first DAC 3 are provided, for example, as many as the number of bits of the first bit string signal DI. Similarly, the plurality of current sources 11 and the plurality of switches 12 for the second DAC 4 are provided, for example, as many as the number of bits of the second bit string signal DF. In addition, the plurality of current sources 11 and the plurality of switches 12 for the third DAC 5 are provided, for example, as many as the number of bits of the first digital signal Dinc. For example, when a value of an arbitrary bit of the first bit string signal DI, the second bit string signal DF, or the first digital signal Dinc is one, the corresponding switch 12 is closed, and a current flows from the current source 11 connected to this switch 12 to the resistor 13. Conversely, when a value of an arbitrary bit of the first bit string signal DI, the second bit string signal DF, or the first digital signal Dinc is zero, the corresponding switch 12 is opened, and no current flows from the current source 11 connected to this switch 12 to the resistor 13.

Since a total value of currents flowing through the plurality of current sources 11 of each DAC flows through the resistor 13, a voltage Vout at one end of the resistor 13 has a value corresponding to the number of the current sources 11 from which the currents flow. As described above, since the analog calculator 6 calculates the value obtained by subtracting the third analog value A3 from the value obtained by adding the second analog value A2 to the first analog value A1, a condition for switching the switch 12 of the third DAC 5 may be set to be reverse to those of the first DAC 3 and the second DAC 4. For example, the corresponding switch 12 may be turned on when each bit of the first digital signal Dinc input to the third DAC 5 is zero, and the corresponding switch 12 may be turned off when each bit thereof is one.

The quantizer 7 of FIG. 1 outputs a second digital signal Dq obtained by quantizing an output signal of the analog calculator 6. The second digital signal Dq is input to the control logic unit 8.

The mode switching unit 10 selects either a first mode of causing an operation to follow the overall gain drift of the DA converter 1 of FIG. 1 or a second mode of causing an operation to follow gain drift between the first DAC 3 and the second DAC 4.

For example, the mode switching unit 10 may randomly perform switching to the first mode or the second mode in accordance with a random number or a pseudo-random number generated by a random number generator (not illustrated). Alternatively, the mode switching unit 10 may alternately switch the first mode and the second mode. Alternatively, each time one of the first mode and the second mode is consecutively selected a plurality of times, the other mode may be selected once. In this manner, a frequency and a timing at which the mode switching unit 10 performs switching to the first mode or the second mode are arbitrary.

An operation of the control logic unit 8 varies depending on the mode to be switched by the mode switching unit 10. More specifically, when the first mode is selected by the mode switching unit 10, the control logic unit 8 generates the third digital signal Dcor such that the digital input signal Din coincides with the second digital signal Dq, and initializes the first digital signal Dinc to zero. On the other hand, when the second mode is selected, the control logic unit 8 generates the first digital signal Dinc such that the digital input signal Din coincides with the second digital signal Dq.

In this manner, the control logic unit 8 performs control such that the second digital signal Dq output from the quantizer 7 coincides with the digital input signal Din regardless of the first mode or the second mode. Since the DA converter 1 of FIG. 1 repeatedly and continuously performs the operation following the gain drift of the first mode and the second mode, the control logic unit 8 performs control such that an average value of the second digital signal Dq coincides with an average value of the digital input signal Din.

Figure 3:
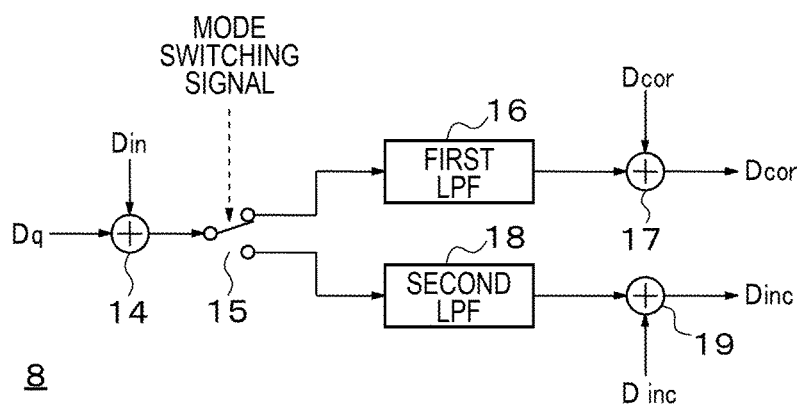
FIG. 3 is a block diagram illustrating an example of an internal configuration of the control logic unit.

FIG. 3 is a block diagram illustrating an example of an internal configuration of the control logic unit 8. As illustrated in FIG. 3, the control logic unit 8 includes a second digital calculator 14, a switch 15, a first low-pass filter (hereinafter referred to as a first LPF) 16, a third digital calculator 17, a second low-pass filter (hereinafter referred to as a second LPF) 18, and a fourth digital calculator 19.

The second digital calculator 14 outputs a fifth digital signal which is a calculation result of a difference (Dq−Din) between the second digital signal Dq output from the quantizer 7 and the digital input signal Din. The switch 15 inputs the fifth digital signal to the first LPF 16 when the mode switching unit 10 selects the first mode, and inputs the fifth digital signal to the second LPF 18 when the mode switching unit 10 selects the second mode.

The first LPF 16 outputs a sixth digital signal obtained by filtering the fifth digital signal. The third digital calculator 17 updates the third digital signal Dcor with a value obtained by adding the sixth digital signal to the third digital signal Dcor. The second LPF 18 outputs a seventh digital signal obtained by filtering the fifth digital signal. The fourth digital calculator 19 updates the first digital signal Dinc with a value obtained by adding the seventh digital signal to the first digital signal Dinc.

Figure 4:
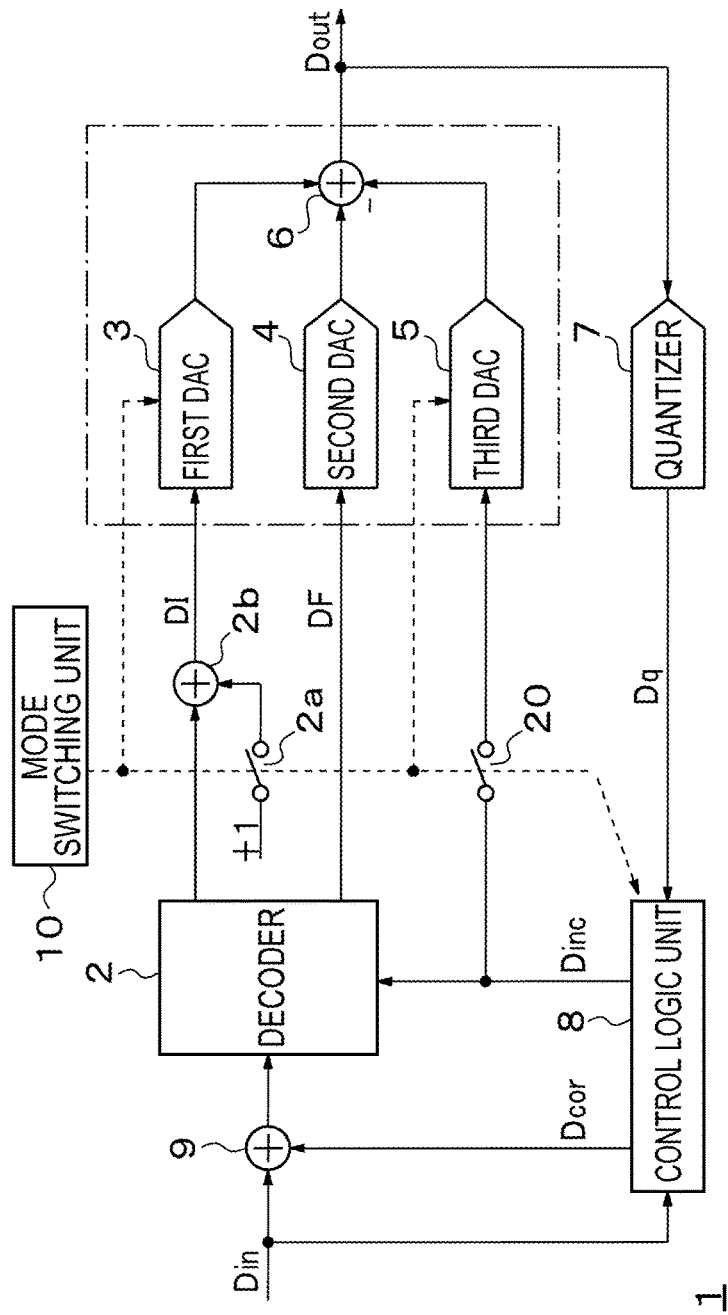
FIG. 4 is a diagram for describing an operation around a decoder.

FIG. 4 is a diagram for describing an operation around a decoder 2. The decoder 2 is provided with a switch 2a and a fifth digital calculator 2b as illustrated in FIG. 4. Although the switch 2a and the fifth digital calculator 2b are disposed outside the block of the decoder 2 in FIG. 4, the switch 2a and the fifth digital calculator 2b can also be regarded as a part of the decoder 2.

The switch 2a selects "1" in the second mode and inputs it to the fifth digital calculator 2b. In the second mode, the fifth digital calculator 2b inputs a digital signal obtained by adding "1" to a value DI calculated by Formula (1) to the first DAC 3 as the first bit string signal DI. In addition, in the first mode, the fifth digital calculator 2b inputs the value DI calculated by Formula (1) directly to the first DAC 3 as the first bit string signal DI.

Incidentally, a switch 20 that switches whether or not to input the first digital signal Dinc to the third DAC 5 is provided in the control logic unit 8 as illustrated in FIG. 4. The switch 20 inputs zero to the third DAC 5 in the first mode. Accordingly, the third DAC 5 outputs a third analog value corresponding to zero. On the other hand, the switch 20 inputs the first digital signal Dinc to the third DAC 5 in the second mode.

Figure 5:
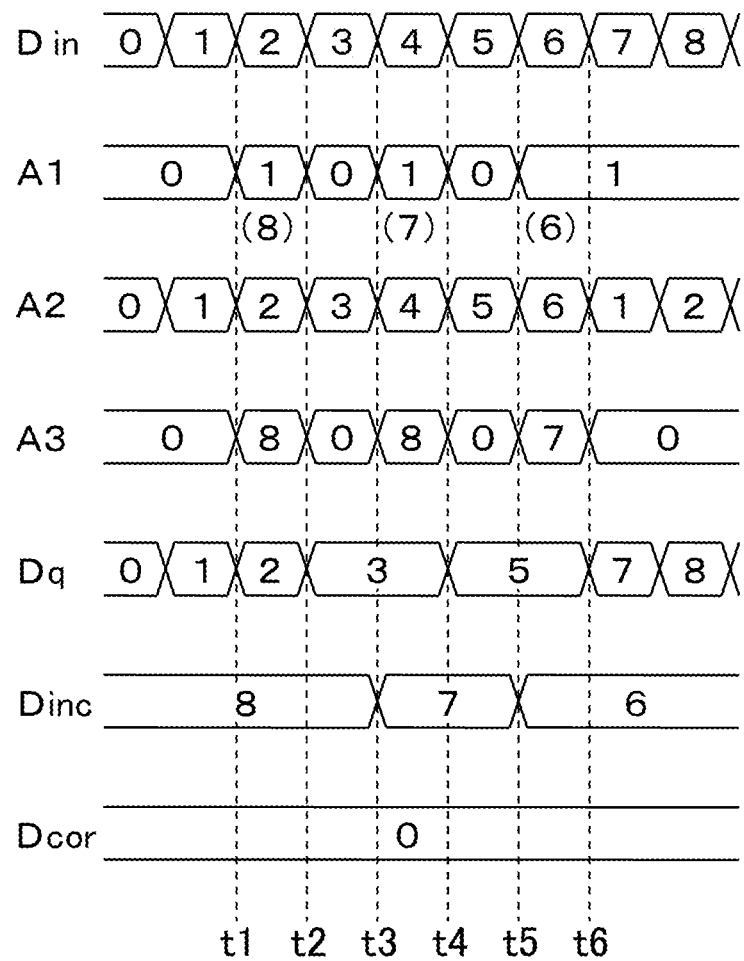
FIG. 5 is an operation timing chart of the DA converter of FIG. 1.

FIG. 5 is an operation timing chart of the DA converter 1 of FIG. 1. FIG. 5 illustrates an example in which the mode switching unit 10 alternately selects the first mode and the second mode. More specifically, the mode switching unit 10 selects the second mode at times t1 to t2, t3 to t4, and t6 to t7 in FIG. 5, and selects the first mode at times t2 to t3 and t5 to t6. FIG. 5 illustrates an example (A1=8→7→6) in which the first analog value A1 output from the first DAC 3 gradually changes due to the gain drift although the same value (=1) is input to the first DAC 3.

FIG. 5 illustrates an example in which the digital input signal Din increases one by one from "1", and the digital input signal Din at time t1 to t2 is "2". Accordingly, the first bit string signal DI is "1" as a result of addition of "1" by the first digital calculator 9 of FIG. 4 at time t1 to t2.

Therefore, the first DAC 3 outputs an analog value corresponding to 1 LSB. At time t1 to t2 in FIG. 5, the first DAC 3 outputs "8", which is an ideal value, as 1 LSB in this example. Since the digital input signal Din is "2" at time t1 to t2, the second bit string signal DF is "2", and "2" is input to the second DAC 4. In addition, the carry code (first digital signal Dinc) output from the control logic unit 8 is an initial value (=8) at time t1 to t2. Therefore, the third DAC 5 outputs "8".

The analog calculator 6 adds the second analog value A2 (=2) output from the second DAC 4 to the first analog value A1 (=8) output from the first DAC 3, and outputs a value (8+2−8=2) obtained by subtracting the third analog value A3 (=8) output from the third DAC 5 from the added value. Accordingly, the quantizer 7 outputs the second digital signal Dq (=2) obtained by quantizing the value (=2) output from the analog calculator 6.

As illustrated in the block diagram of FIG. 3, the control logic unit 8 first generates the fifth digital signal (2−2=0) obtained by calculating a difference between the second digital signal Dq (=2) output from the quantizer 7 and the digital input signal Din (=2) using the second digital calculator 14. Next, the second LPF 18 and the fourth digital calculator 19 update the third digital signal Dcor (=8) with the value (=8) obtained by adding zero to the current third digital signal Dcor (=8).

Next, the value DI (=0) calculated by Formula (1) is directly input to the first DAC 3 as the first bit string signal DI at time t2 to t3. The second bit string signal DF input to the second DAC 4 is "3", which is the same as the digital input signal Din. Zero is always input to the third DAC 5 in the first mode. Thus, the analog calculator 6 adds the second analog value A2 (=2) output from the second DAC 4 to the first analog value A1 (=0) output from the first DAC 3, and outputs a value (0+3−0=3) obtained by subtracting the third analog value A3 (=0) output from the third DAC 5 from the added value. Accordingly, the quantizer 7 outputs the second digital signal Dq (=3) obtained by quantizing the value (=3) output from the analog calculator 6.

As illustrated in the block diagram of FIG. 3, the control logic unit 8 first generates the fifth digital signal (3−3=0) obtained by calculating a difference between the second digital signal Dq (=3) output from the quantizer 7 and the digital input signal Din (=3) using the second digital calculator 14. Next, the first LPF 16 and the third digital calculator 17 update the third digital signal Dcor (=8) with a value (=8) obtained by adding zero to the current third digital signal Dcor (=8). Since the digital input signal Din (=3) coincides with the second digital signal Dq (=3) output from the quantizer 7 at time t2 to t3, the third digital signal Dcor is 3−3=0, and the first digital calculator 9 inputs the digital input signal Din directly to the decoder 2. Accordingly, the occurrence of overall gain drift is canceled.

At time t3 to t4, the digital input signal Din is "4", and first bit string data is "1", but the first analog value A1 output from the first DAC 3 decreases to "7" due to the gain drift. The second analog value A2 output from the second DAC 4 is "4", which is the same as the digital input signal Din. Since the first digital signal Dinc is "8", the third DAC 5 is "8". Accordingly, the analog calculator 6 outputs 7+4−8=3. As a result, the second digital calculator 14 in the control logic unit 8 outputs the fifth digital signal (3−4=−1) which is a calculation result of a difference between the second digital signal Dq (=3) output from the quantizer 7 and the digital input signal Din (=4). Next, the second LPF 18 and the fourth digital calculator 19 update the third digital signal Dcor (=7) with a value (=7) obtained by adding −1 to the current third digital signal Dcor (=8). As a result, the third digital signal Dcor is corrected to a value obtained in consideration of the influence of the gain drift of the first DAC 3. Accordingly, the operation following the gain drift between the first DAC 3 and the second DAC 4 is performed.

At time t4 to t5, the same operation in the first mode as that at time t2 to t3 is performed. At time t5 to t6, the digital input signal Din is "6", and first bit string data is "1", but the first analog value A1 output from the first DAC 3 decreases to "6" due to the gain drift.

The second analog value A2 output from the second DAC 4 is "6", which is the same as the digital input signal Din. Since the first digital signal Dinc is "7", the third DAC 5 is "7". Accordingly, the analog calculator 6 outputs 6+6−7=5. As a result, the second digital calculator 14 in the control logic unit 8 outputs the fifth digital signal (5−6=−1) obtained by calculating a difference between the second digital signal Dq (=5) output from the quantizer 7 and the digital input signal Din (=6). Next, the second LPF 18 and the fourth digital calculator 19 add −1 to the current third digital signal Dcor (=7) and output a new third digital signal Dcor (=6). As a result, the third digital signal Dcor is corrected to a value obtained in consideration of the influence of the gain drift of the first DAC 3.

In this manner, since the first mode and the second mode are alternately switched in the example of FIG. 5, the operation following the gain drift between the first DAC 3 and the second DAC 4 is performed, and it is possible to perform the operation following the overall gain drift of the DA converter 1.

Figure 6:
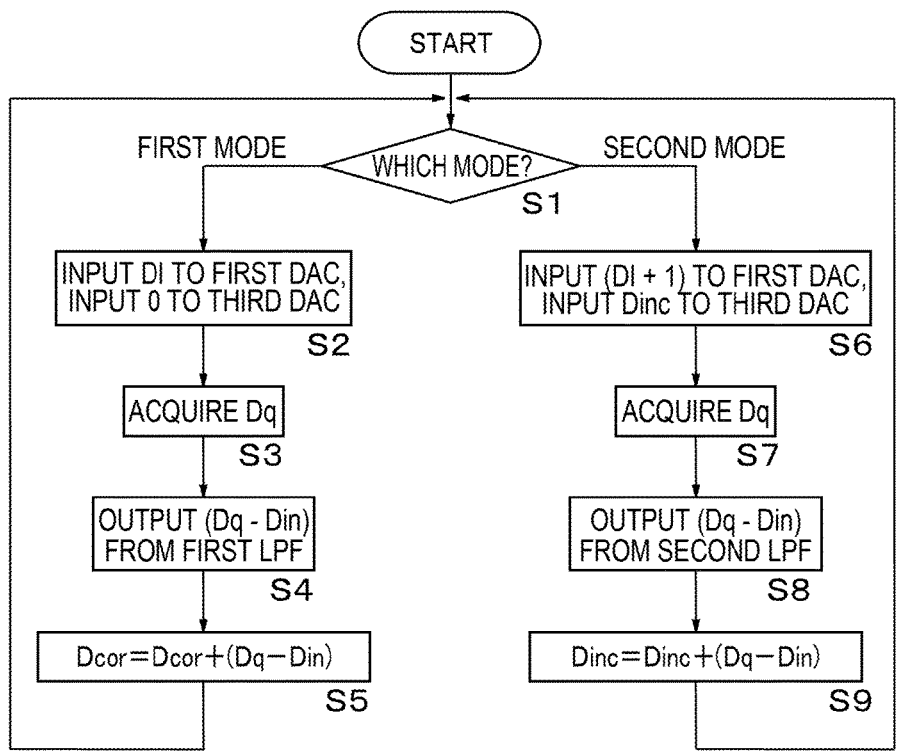
FIG. 6 is a flowchart illustrating a processing operation of the DA converter of FIG. 1.

FIG. 6 is a flowchart illustrating a processing operation of the DA converter 1 of FIG. 1. First, whether the mode is the first mode or the second mode is determined (Step S1). Here, the mode determination may be performed by a mode switching signal from the mode switching unit 10.

When it is determined to be the first mode, processes of Steps S2 to S5 are performed. First, the decoder 2 inputs the first bit string data DI obtained using the above-described Formula (1) to the first DAC 3.

In addition, the control logic unit 8 sets the first digital signal Dinc to zero and inputs the first digital signal Dinc to the third DAC 5 (Step S2). Then, the first DAC 3, the second DAC 4, the third DAC 5, the analog calculator 6, and the quantizer 7 are operated.

Next, the control logic unit 8 acquires the second digital signal Dq output from the quantizer 7 (Step S3). Subsequently, the second digital calculator 14 and the first LPF 16 in the control logic unit 8 output the sixth digital signal (Dq−Din) obtained by subtracting the digital input signal Din from the second digital signal Dq (Step S4). Subsequently, the third digital calculator 17 in the control logic unit 8 calculates the third digital signal Dcor=the third digital signal Dcor+the sixth digital signal to update the third digital signal Dcor (Step S5). Thereafter, the processing returns to Step S1.

On the other hand, when it is determined to be the second mode in Step S1, processes of Steps S6 to S9 are performed. First, the decoder 2 inputs the first bit string data, obtained by adding "1" to the value DI obtained using the above-described Formula (1), to the first DAC 3. In addition, the control logic unit 8 directly inputs the first digital signal Dinc to the third DAC 5 (Step S6). Then, the first DAC 3, the second DAC 4, the third DAC 5, the analog calculator 6, and the quantizer 7 are operated.

Next, the control logic unit 8 acquires the second digital signal Dq output from the quantizer 7 (Step S7). Subsequently, the second digital calculator 14 and the second LPF 18 in the control logic unit 8 output the seventh digital signal (Dq−Din) obtained by subtracting the digital input signal Din from the second digital signal Dq (Step S8). Subsequently, the third digital calculator 17 in the control logic unit 8 calculates the first digital signal Dinc=the first digital signal Dinc+the sixth digital signal to update the first digital signal Dinc (Step S5). Thereafter, the processing returns to Step S1.

Although the DA converter 1 of FIG. 1 has been illustrated with the example in which either the first mode or the second mode is selected by the mode switching unit 10, only the operation following the gain drift between the first DAC 3 and the second DAC 4 may be performed by partially changing the configuration of the DA converter 1 of FIG. 1. In this case, for example, the mode switching unit 10 and the first digital calculator 9 in FIG. 1 are unnecessary, and the mode switching unit 10 (FIG. 4) in the decoder 2 can also be omitted. Accordingly, when only the operation following the gain drift between the first DAC 3 and the second DAC 4 is performed, the configuration of the DA converter 1 can be simplified from FIG. 1.

In this manner, data corresponding to 1 LSB is added to the first DAC 3 such that an analog value corresponding to the data is offset by the third DAC 5 which is the replica of the second DAC 4 in order to perform the operation following the gain drift between the first DAC 3, which performs the DA conversion of the MSB side string of the digital input signal Din, and the second DAC 4 which performs the DA conversion of the LSB side string, in the first embodiment. As a result, even when the gain drift between the first DAC 3 and the second DAC 4 occurs due to temperature or the like, the operation following the gain drift can be performed.

In addition, either the operation following the overall gain drift of the DA converter 1 or the operation following the gain drift between the first DAC 3 and the second DAC 4 is switched by the mode switching and performed in the present embodiment. Thus, it is possible to perform not only the operation following the gain drift caused by a mismatch between electrical characteristics of the first DAC 3 and the second DAC 4 but also the operation following the overall gain drift of the DA converter 1.

In particular, it is possible to perform the operation following the overall gain drift of the DA converter 1 and the operation following the gain drift between the first DAC 3 and the second DAC 4 in a well-balanced manner by randomly performing the mode switching.

Second Embodiment

The above-described third DAC 5 is the replica of the second DAC 4. However, it is not guaranteed that the electrical characteristics are completely the same although the third DAC 5 is the replica of the second DAC 4, and there is a risk that a slight deviation in gain drift or the like may occur due to a manufacturing variation or the like. Therefore, a countermeasure for such a risk is taken in a second embodiment.

Figure 7:
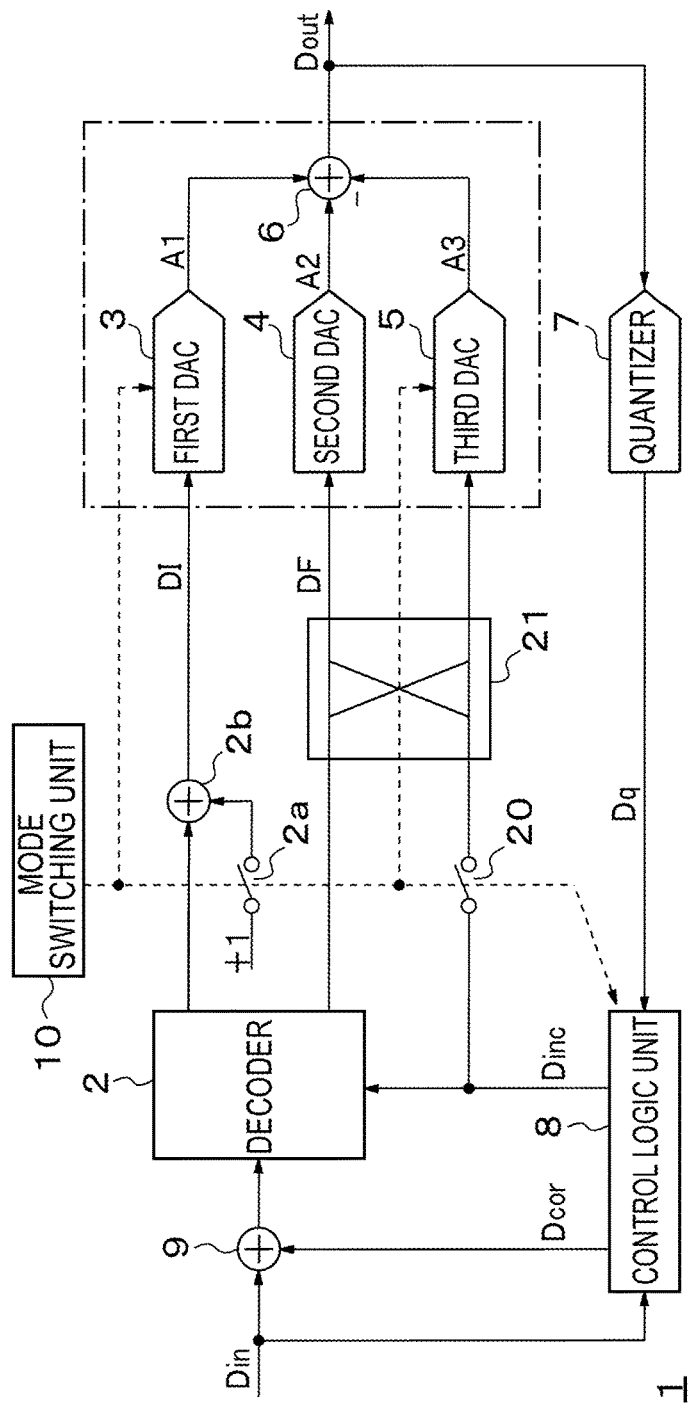
FIG. 7 is a block diagram illustrating a schematic configuration of a DA converter according to a second embodiment.

FIG. 7 is a block diagram illustrating a schematic configuration of the DA converter 1 according to the second embodiment. The DA converter 1 of FIG. 7 is obtained by adding an input switching unit 21 to the DA converter 1 of FIG. 4. The input switching unit 21 switches input data of the second DAC 4 and input data of the third DAC 5 with each other. As the input switching unit 21 switches the input data, switching is made between a case where the second bit string signal DF is input to the second DAC 4 and the first digital signal Dinc is input to the third DAC 5, and a case where the first digital signal Dinc is input to the second DAC 4 and the second bit string signal DF is input to the third DAC 5. A timing at which the input switching unit 21 performs the switching is arbitrary. In the example of FIG. 4, the switching of the input data between the second DAC 4 and the third DAC 5 is performed at a random timing in accordance with a random number from a random number generator.

Incidentally, the analog calculator 6 calculates the first analog value A1+the second analog value A2−the third analog value A3. Thus, when inputs of the second DAC 4 and the third DAC 5 are switched with each other, it is necessary to switch signs of output values of the second DAC 4 and the third DAC 5 with each other in accordance with the switching of inputs.

In this manner, the inputs of the second DAC 4 and the third DAC 5 are switched at random or a predetermined timing in the second embodiment. Thus, even if there is a difference in electrical characteristic between the second DAC 4 and the third DAC 5, the difference can be averaged, and it is possible to perform the operation following the gain drift with high accuracy.

Third Embodiment

The DA converter 1 according to the first or second embodiment can be widely applied to an oscillator, PLL circuitry, and the like.

Figure 8:
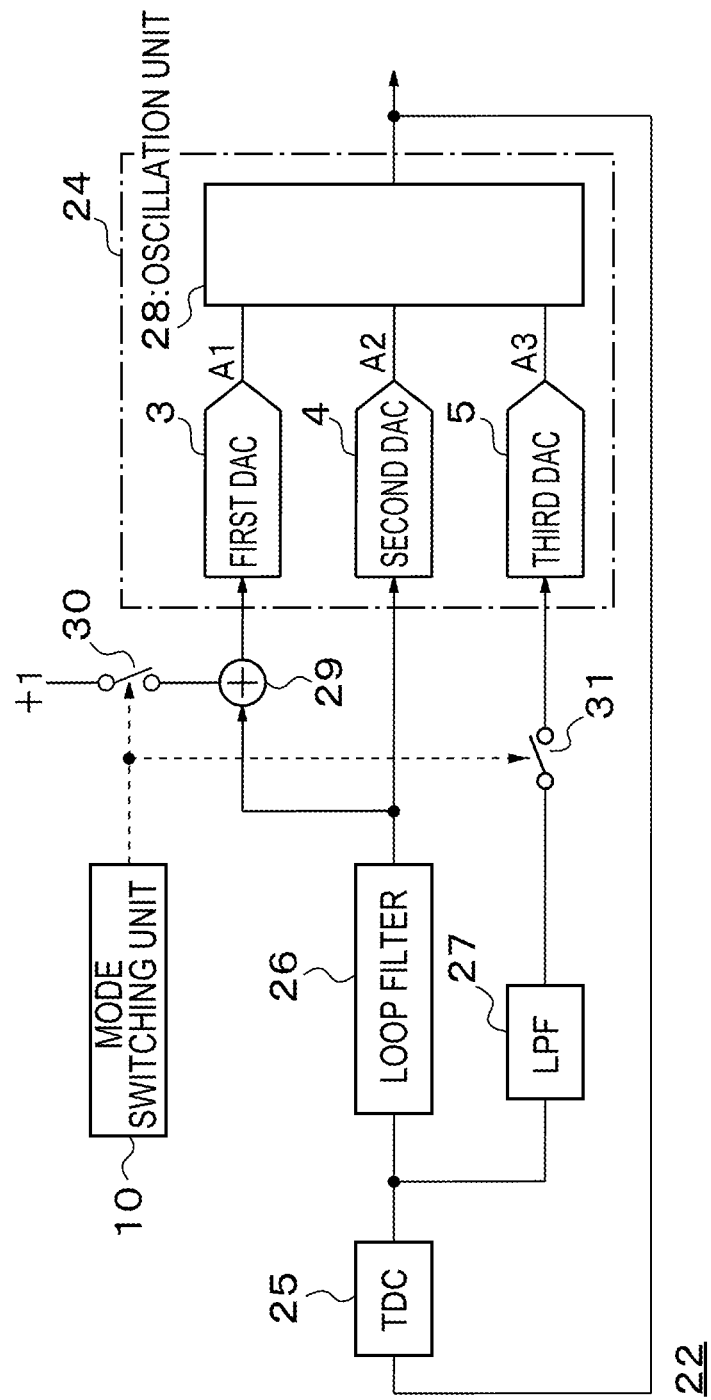
FIG. 8 is a block diagram illustrating a schematic configuration of ADPLL circuitry incorporating a DA converter.

FIG. 8 is a block diagram illustrating a schematic configuration of ADPLL circuitry 22 incorporating the DA converter 1 according to the first or second embodiment. The ADPLL circuitry 22 in FIG. 8 includes the first DAC 3, the second DAC 4, the third DAC 5, the mode switching unit 10, a digital-controlled oscillator (DCO) 24, a time-to-digital converter (TDC) 25, a loop filter (third filter) 26, and a low-pass filter (fourth filter) 27.

The oscillator 24 controls an oscillation frequency of an oscillation signal based on the first analog value A1 output from the first DAC 3 and the second analog value A2 output from the second DAC 4. For example, a ring oscillation unit 28 in which a plurality of inverters is connected in a ring shape may be provided inside the oscillator 24, and the oscillation frequency may be controlled by varying a propagation delay time of each inverter in accordance with the first analog value A1 and the second analog value A2.

The TDC 25 generates an eighth digital signal corresponding to a frequency error between the oscillation frequency of the oscillation signal output from the oscillator 24 and a target frequency. The TDC 25 operates as the quantizer 7 in FIG. 1, for example. The loop filter 26 filters the eighth digital signal output from the TDC 25 to be fed back to input sides of the first DAC 3 and the second DAC 4. A digital adder 29 is provided between the loop filter 26 and the input terminal of the first DAC 3. In the above-described second mode, the digital adder 29 adds "1" to a MSB side string of an output signal of the loop filter 26 via the switch 30 to generate first bit string data for the input of the first DAC 3. In the above-described first mode, the digital adder 29 directly inputs the MSB side string of the output signal of the loop filter 26 to the first DAC 3 as the first bit string data. A LSB side string of the output signal of the loop filter 26 is input to the second DAC 4 as the second bit string data.

The low-pass filter 27 filters the eighth digital signal output from the TDC 25 to be fed back to the input side of the third DAC 5. A switch 31, which switches whether to input an output signal of the low-pass filter 27 or zero to the third DAC 5, is provided between the low-pass filter 27 and the third DAC 5.

Incidentally, FIG. 8 is an example of the ADPLL circuitry 22, and the internal configuration of the ADPLL circuitry 22 may be arbitrarily changed except that the first or second DA conversion unit is used.

In this manner, since the ADPLL circuitry 22 according to the third embodiment includes the DA converter 1 according to the first or second embodiment, it is possible to perform the operation following the gain drift due to temperature or the like and to improve reliability of the ADPLL circuitry 22.

At least some functions of the DA converter 1 and the ADPLL circuitry 22 described in the above embodiments may be configured by hardware or software. When configuring by the software, a program to implement at least some functions of the DA converter 1 and the ADPLL circuitry 22 may be stored in a recording medium such as a flexible disk and a CD-ROM, and then, may be read and executed by a computer mounted on the DA converter 1 and the ADPLL circuitry 22 or performing radio communication with the DA converter 1 and the ADPLL circuitry 22. The recording medium is not limited to a detachable storage medium, such as a magnetic disk and an optical disc, and may be a fixed recording medium, such as a hard disk and a memory. Alternatively, this program may be stored in a semiconductor chip in the form of a microcode, and a controller of the semiconductor chip may execute the microcode. In addition, the program to implement at least some functions of the DA converter 1 and the ADPLL circuitry 22 may be distributed through a communication line (including radio communication) such as the Internet. Further, the program that has been encrypted, modulated, or compressed, may be distributed through a wired line or a wireless line, such as the Internet, or may be stored in a recording medium and then may be distributed.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. A DA converter comprising:
   a first DA conversion unit that converts a first bit string signal corresponding to a MSB side string of a digital input signal having a plurality of bits into a first analog value;
   a second DA conversion unit that converts a second bit string signal corresponding to an LSB side string of the digital input signal into a second analog value;
   a third DA conversion unit that has identical circuitry configuration and identical circuitry area as the second DA conversion unit and converts a first digital signal into a third analog value;
   an analog calculator that calculates a value obtained by subtracting the third analog value from a value obtained by adding the second analog value to the first analog value;
   a quantizer that outputs a second digital signal obtained by quantizing an output value of the analog calculator; and a control logic unit that generates the first digital signal such that the digital input signal coincides with the second digital signal.

2. The DA converter according to claim 1, wherein
the third DA conversion unit outputs the third analog value that corresponds to 1 LSB of the first DA conversion unit.

3. The DA converter according to claim 1, wherein
the first bit string signal is a signal obtained by adding "1" to the MSB side string of the digital input signal.

4. The DA converter according to claim 1, further comprising:
a first digital calculator that outputs a fourth digital signal obtained by adding a third digital signal to the digital input signal; and
a decoder that generates the first bit string signal and the second bit string signal based on the first digital signal and the fourth digital signal,
wherein the control logic unit generates the third digital signal such that the digital input signal coincides with the second digital signal, and initializes the first digital signal to zero.

5. The DA converter according to claim 4, further comprising:
a mode switching unit that selects any one of a first mode of performing an operation following an overall gain drift when converting the digital input signal to an analog value, and a second mode of performing an operation following gain drift between the first DA conversion unit and the second DA conversion unit,
wherein the control logic unit
generates the third digital signal such that the digital input signal coincides with the second digital signal and initializes the first digital signal to zero when the first mode is selected, and
generates the first digital signal such that the digital input signal coincides with the second digital signal when the second mode is selected.

6. The DA converter according to claim 5, wherein
the mode switching unit selects the first mode or the second mode randomly, alternately, or at a predetermined cycle.

7. The DA converter according to claim 5, wherein
the mode switching unit selects the first mode or the second mode during analog conversion of the digital input signal.

8. The DA converter according to claim 7, wherein
the control logic unit makes the digital input signal coincide with an average value of the second digital signal during analog conversion of the digital input signal.

9. The DA converter according to claim 5, wherein
the control logic unit includes:
a second digital calculator that outputs a fifth digital signal which is a calculation result of a difference between the second digital signal and the digital input signal;
a first filter that outputs a sixth digital signal obtained by filtering the fifth digital signal in the first mode;
a third digital calculator that updates the third digital signal with a value obtained by adding the sixth digital signal to the third digital signal in the first mode;
a second filter that outputs a seventh digital signal obtained by filtering the fifth digital signal in the second mode; and
a fourth digital calculator that updates the second digital signal with a value obtained by adding the seventh digital signal to the second digital signal in the second mode.

10. The DA converter according to claim 9, wherein
the sixth digital signal is held until the first filter performs next new filtering, and
the seventh digital signal is held until the second filter performs next new filtering.

11. The DA converter according to claim 1, further comprising:
an input switching unit that switches input data of the second DA conversion unit and input data of the third DA conversion unit with each other.

12. The DA converter according to claim 11, wherein
the input switching unit performs switching randomly, alternately, or at a predetermined cycle.

13. ADPLL circuitry comprising:
a DA converter;
an oscillator that controls an oscillation frequency of a digital oscillation signal based on a first analog value and a second analog value of the DA converter;
a time-to-digital converter that outputs an eighth digital signal corresponding to a frequency error between the oscillation frequency and a target frequency;
a third filter that filters the eighth digital signal to be fed back to input sides of a first DA conversion unit and a second DA conversion unit; and
a fourth filter that filters the eighth digital signal to be fed back to an input side of a third DA conversion unit,
wherein the DA converter includes:
the first DA conversion unit that converts a first bit string signal corresponding to a MSB side string of a digital input signal having a plurality of bits into the first analog value;
the second DA conversion unit that converts a second bit string signal corresponding to a LSB side string of the digital input signal into the second analog value;
the third DA conversion unit that has identical circuitry configuration and identical circuitry area as the second DA conversion unit and converts a first digital signal into a third analog value;
an analog calculator that calculates a value obtained by subtracting the third analog value from a value obtained by adding the second analog value to the first analog value;
a quantizer that outputs a second digital signal obtained by quantizing an output value of the analog calculator; and
a control logic unit that generates the first digital signal such that the digital input signal coincides with the second digital signal, and
the time-to-digital converter operates as the quantizer.

14. The ADPLL circuitry according to claim 13, wherein
the third DA conversion unit outputs the third analog value that corresponds to 1 LSB of the first DA conversion unit.

15. The ADPLL circuitry according to claim 13, wherein
the first bit string signal is a signal obtained by adding "1" to the MSB side string of the digital input signal.

16. The ADPLL circuitry according to claim 13, further comprising:
a first digital calculator that outputs a fourth digital signal obtained by adding a third digital signal to the digital input signal; and a decoder that generates the first bit string signal and the second bit string signal based on the first digital signal and the fourth digital signal, wherein the control logic unit generates the third digital signal such that the digital input signal coincides with the second digital signal, and initializes the first digital signal to zero.

17. The ADPLL circuitry according to claim 16, further comprising:

a mode switching unit that selects any one of a first mode of performing an operation following an overall gain drift when converting the digital input signal to an analog value, and a second mode of performing an operation following gain drift between the first DA conversion unit and the second DA conversion unit, wherein the control logic unit generates the third digital signal such that the digital input signal coincides with the second digital signal and initializes the first digital signal to zero when the first mode is selected, and generates the first digital signal such that the digital input signal coincides with the second digital signal when the second mode is selected.

18. The ADPLL circuitry according to claim 17, wherein the mode switching unit selects the first mode or the second mode randomly, alternately, or at a predetermined cycle.

19. The ADPLL circuitry according to claim 17, wherein the mode switching unit selects the first mode or the second mode during analog conversion of the digital input signal.

20. The ADPLL circuitry according to claim 19, wherein the control logic unit makes the digital input signal coincide with an average value of the second digital signal during analog conversion of the digital input signal.

* * * * *